United States Patent [19]

Mazin et al.

[11] Patent Number: 4,484,088

[45] Date of Patent: Nov. 20, 1984

[54] CMOS FOUR-TRANSISTOR RESET/SET LATCH

[75] Inventors: Moshe Mazin; William E. Engeler, both of Scotia, N.Y.

[73] Assignee: General Electric Company, Schenectady, N.Y.

[21] Appl. No.: 464,098

[22] Filed: Feb. 4, 1983

[51] Int. Cl.³ .................... H03K 3/356; H01L 29/78
[52] U.S. Cl. .................... 307/279; 307/288; 357/23
[58] Field of Search ............ 307/448, 451, 200 B, 307/279, 288; 357/23 D

[56] References Cited

U.S. PATENT DOCUMENTS

| | | | |
|---|---|---|---|
| 3,892,985 | 7/1975 | Kawagoe | 307/279 |
| 3,916,430 | 10/1975 | Heuner et al. | 307/279 X |
| 4,039,862 | 8/1977 | Dingwall et al. | 307/279 X |
| 4,039,869 | 8/1977 | Goldman et al. | 307/279 X |
| 4,042,841 | 8/1977 | Hills et al. | 307/448 X |
| 4,150,308 | 4/1979 | Adlhoch | 307/279 X |
| 4,321,616 | 3/1982 | Bise | 357/23 D X |
| 4,384,220 | 5/1983 | Segawa et al. | 307/450 |
| 4,408,305 | 10/1983 | Kuo | 307/450 X |

FOREIGN PATENT DOCUMENTS 109028 8/1980 Japan ............................ 307/279

OTHER PUBLICATIONS

Gaensslen et al., "FET Memory Cell", *IBM Tech. Discl. Bull.*; vol. 13, No. 7, pp. 1751; 12/1970.
Lee, "Race-Free Level Sensitive Master-Slave Latch Utilizing a Single Phase Clock"; *IBM Tech. Discl. Bull.*, vol. 20, No. 1, pp. 263-264; 6/77.

*Primary Examiner*—Larry N. Anagnos
*Attorney, Agent, or Firm*—Julius J. Zaskalicky; James C. Davis, Jr.; Marvin Snyder

[57] ABSTRACT

An R/S latch circuit employing four IGFETs, one pair of P-channel IGFETs, and another pair of N-channel IGFETs. The P-channel IGFETs have channels respectively connecting Q and $\overline{Q}$ data output nodes to $+V_{DD}$, and gates cross-connected to the opposite data output nodes. The N-channel IGFETs have channels respectively connecting the Q and $\overline{Q}$ data output nodes to ground, and have gates which respectively comprise the Reset (R) and Set (S) data inputs. A pair of high impedance leakage current paths may also be provided respectively electrically connecting the Q and $\overline{Q}$ data output nodes to ground. Particular integrated circuit R/S latch structures are disclosed.

2 Claims, 8 Drawing Figures

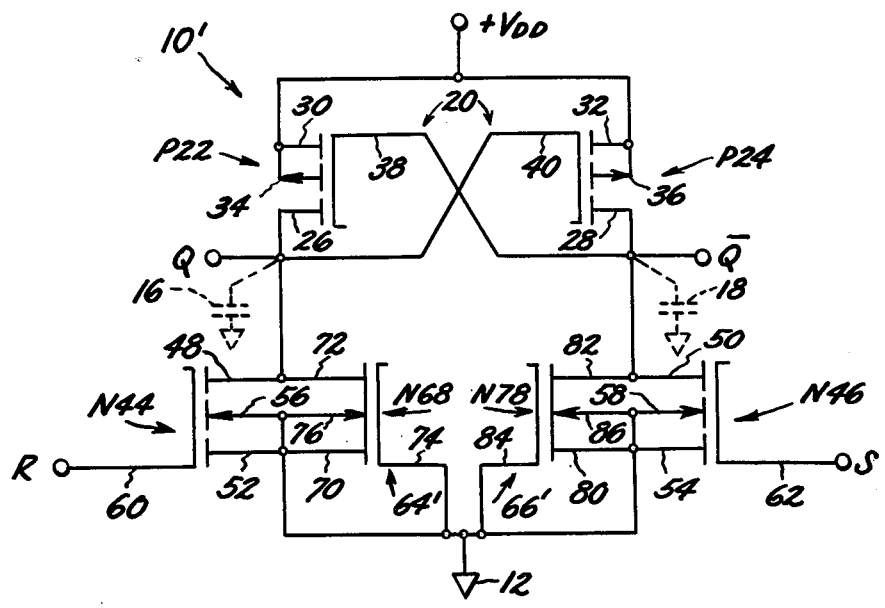
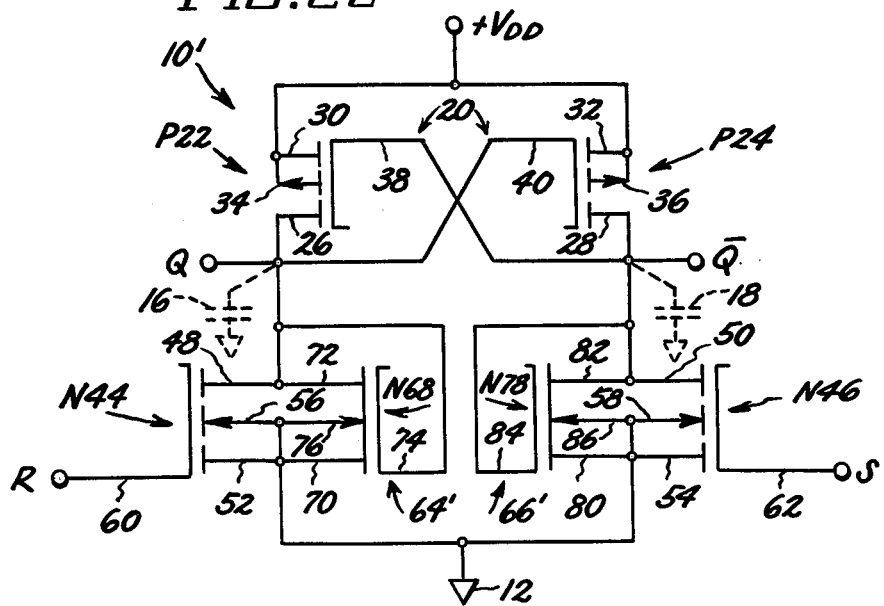

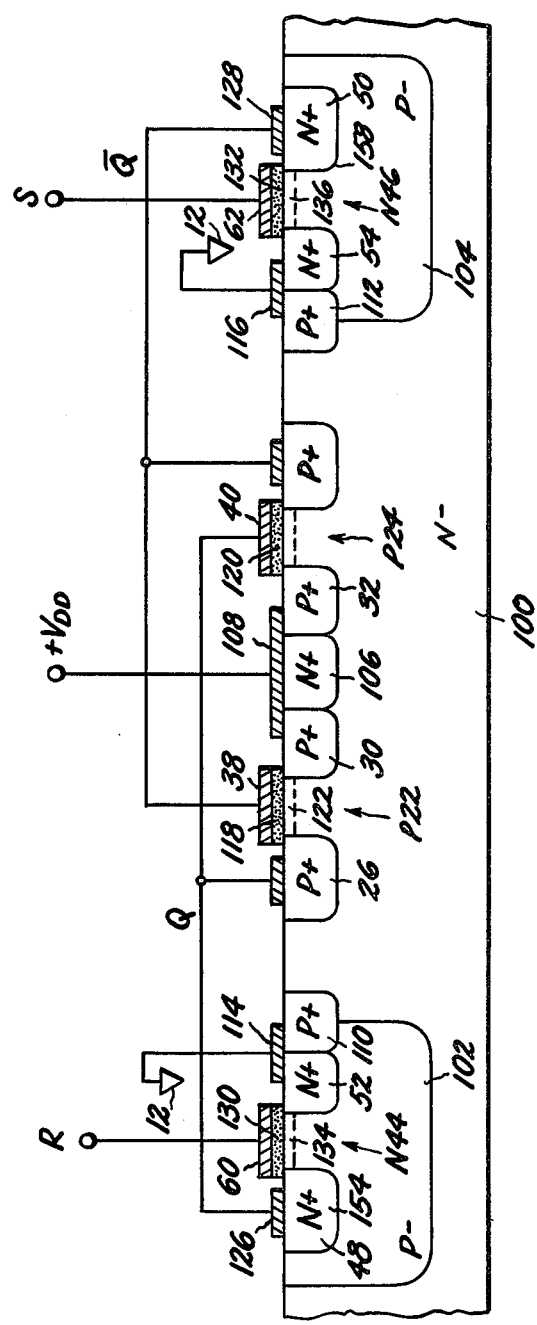

CMOS FOUR-TRANSISTOR RESET/SET LATCH

BACKGROUND OF THE INVENTION

The present invention relates generally to logic circuits of the type fabricated on a monolithic semiconductor chip employing insulated-gate field-effect transistors (IGFETs) and, more paricularly, to a Reset/Set (R/S) latch.

As is known, an R/S latch is a form of flip-flop useful in digital logic applications. An R/S latch has a pair of inputs, designed Set (S) and Reset (R), and a pair of normally-complementary data outputs, Q and $\overline{Q}$.

Operation of a NOR R/S latch is defined in accordance with the following truth table, where "L" denotes a logic "low" level, also known as binary "0", and "H" denotes a logic "high" level, also known as binary "1". The notation "N/C" means "no change", indicating that the latch outputs remain unchanged for the particular combination of inputs indicated:

| R/S LATCH TRUTH TABLE | | | |
| --- | --- | --- | --- |
| Inputs | | Outputs | |
| R | S | Q | $\overline{Q}$ |
| L | L | N/C | N/C |
| L | H | H | L |
| H | L | L | H |
| H | H | L | L |

As is known, large scale integrated circuits typically comprise a multiplicity of individual logic elements formed on a single integrated circuit employing, for example, metal-oxide-semiconductor (MOS) technology or a form thereof. In the design of such circuits, important considerations are minimizing the transistor count thereby reducing the circuit area required for each individual logic element and maintaining low power dissipation.

SUMMARY OF THE INVENTION

Accordingly, it is an object of the invention to provide an R/S latch circuit having a lower transistor count than previous such circuits, and implemental in MOS integrated circuit form to achieve a higher circuit density than with prior art R/S latch circuits.

A further object of the invention is to provide an R/S latch circuit having low power dissipation.

In accordance with one aspect of the invention an R/S latch is provided which employs only four IGFETs.

In accordance with another aspect of the invention, an R/S latch circuit is provided which employs four IGFETs, and two high impedance current leakage paths. The leakage paths can take various forms.

Briefly, in accordance with the invention, there is provided a Reset/Set latch circuit having first and second data input nodes, e.g. R and S terminals, and first and second complementary data output nodes, e.g. Q and $\overline{Q}$ terminals. The latch includes a pair of voltage supply nodes, one of which, for example, is a positive voltage supply node ($+V_{DD}$) with respect to the other, which is a circuit reference or ground voltage supply node.

The latch includes a first pair of IGFETs of one channel conductivity type, for example, P-channel IGFETs, having respective channels respectively arranged to selectively electrically connect the first and second data output nodes (Q and $\overline{Q}$) to one of the voltage supply nodes, e.g. $+V_{DD}$. The IGFETs of the first pair have respective gates cross-connected to the second and first data output nodes ($\overline{Q}$ and Q), respectively. The latch further includes a second pair of IGFETs of opposite channel conductivity type, in this example, N-channel IGFETS. The IGFETs of the second pair have respective channels respectively arranged to selectively electrically connect the first and second data output nodes (Q and $\overline{Q}$) to the other of the voltage supply nodes (ground), and have respective gates connected to the first and second data input nodes, e.g. R and S, respectively.

Finally, the basic latch includes a pair of high impedance current leakage paths respectively electrically connecting the first and second data output nodes (Q and $\overline{Q}$) to the other voltage supply node (ground).

These leakage paths may take various forms. In one form, leakage paths comprise semiconductor regions with implanted impurities. In another form, these leakage paths comprise depletion-mode IGFETs. In yet another form, these leakage paths are particularly formed high impedance conductive structures.

One particular R/S latch structure in accordance with another aspect of the invention is included in an integrated circuit formed on a semiconductor substrate, and includes a pair of voltage supply nodes. A first pair of IGFETs of one channel conductivity type, e.g. P-channel IGFETs, each include a source region and a drain region of the one conductivity type, (e.g. p+ source and drain regions) formed within the substrate. The IGFETs of the first pair also each include an insulated gate electrode on the substrate configured for inducing a conduction channel between the P+ source region and the P+ drain region of each IGFET of the first pair. The P+ source regions of the first IGFET pair are electrically connected to each other and to one of the pair of voltage supply nodes, e.g. $+V_{DD}$. The P+ drain regions define the complementary output nodes Q and $\overline{Q}$. In a cross-coupled circuit arrangement, the gate electrode of one of the first IGFET pair is electrically connected to the drain region of the other of said first IGFET pair, and the gate electrode of the other of said first IGFET pair is electrically connected to the drain region of the one of said first IGFET pair.

There is also a second pair of IGFETs of opposite channel conductivity type, e.g. N channel IGFETs. Each of the second pair of IGFETs includes a source region and a drain region of the opposite conductivity type, e.g. N+ source and drain regions, formed within the substrate, and each includes an insulated gate electrode on the substrate configured for inducing a conduction channel between the source and drain regions of each of the IGFETs of the second pair. The gate electrodes of the second IGFET pair respectively define first and second data input nodes, e.g. R and S inputs. The N+ source regions of the second IGFET pair are electrically connected to each other and to the other of the pair of voltage supply nodes (ground), and the N+ drain regions of the second IGFET pair are respectively electrically connected to respective P+ drain regions of the first IGFET pair, and thus also to the Q and $\overline{Q}$ complementary data output nodes.

Since both N-channel and P-channel IGFETs are formed on the same substrate, one of the pairs of IGFETs is formed within at least one well region of opposite conductivity type with resepect to the channel conductivity type of the IGFETs of the one pair, and the well region is in turn formed within the substrate. Preferably, it is the IGFETs of the second pair which are formed within a well region. In one particular example, the IGFETs of the one pair are P-channel IGFETs formed directly within an N⁻ conductivity type substrate, and the IGFETs of the second pair are N-channel IGFETs formed within a pair of individual P⁻ conductivity type well region portions, in turn each formed within the N⁻ conductivity type substrate.

To complete the basic R/S latch circuit, a pair of high impedance current leakage paths respectively electrically connect the P+ drain regions of the IGFETs of the first pair to the other voltage supply node, e.g. ground. Various ways of providing the leakage paths are contemplated in accordance with the invention.

More particularly, in accordance with conventional CMOS practice, there are a pair of ohmic contacts between the P⁻ well region portions and the other voltage supply node (ground). Each of the ohmic contacts includes a heavily-doped contact region of the one conductivity type (e.g. a P+ contact region) at a surface of the substrate and adjoining the respective well region. In accordance with the invention, the P+ drain regions of the first pair of IGFETs are respectively laterally spaced from the P+ contact region, defining respective gaps therebetween. The leakage paths are respectively formed across the gaps.

In one specific form, the leakage paths comprise implanted regions of the one conductivity type, e.g. P⁻ implanted regions, formed in the gap.

In another specific form, the leakage paths are in the form of depletion-mode N-channel IGFETs connected across the enhancement-mode N-channel IGFETs.

BRIEF DESCRIPTION OF THE DRAWINGS

While the novel features of the invention are set forth with particularity in the appended claims, the invention, both as to its organization and content will be better understood and appreciated, along with other objects and features thereof, from the following detailed description, taken in conjunction with the drawings, in which:

FIG. 2B is an electrical schematic diagram showing another modification of the circuit of FIG. 1 in accordance with the invention.

FIG. 2C is an electrical schematic diagram showing a further modification of the circuit of FIG. 1 in accordance with the invention;

FIG. 4 is a schematic cross-sectional representation of the physical structure of an R/S latch circuit in accordance with the invention and corresponding to the circuit of FIG. 2A.

DETAILED DESCRIPTION OF THE PREFERRED EMBODIMENTS

Figure 1:
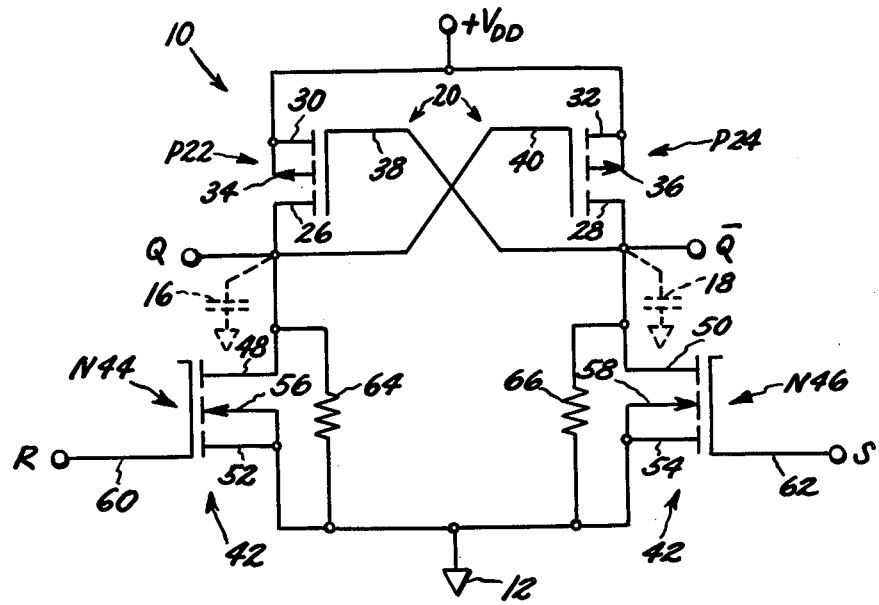
FIG. 1 is an electrical schematic diagram of an R/S latch circuit in accordance with the invention.

It is believed that the invention, its operation and its advantages will be better understood in view of a preliminary review of the characteristics of IGFETs of the type employed in the practice of the invention. It will be appreciated that the term insulated-gate field-effect transistor (IGFET) is employed herein in a generic sense to include various similar field-effect transistor devices such as metal-oxide-semiconductor field-effect transistors (MOSFETs) and metal-insulator-semiconductor field-effect transistors (MISFETs).

In the Figures, both enhacement-mode and depletion-mode IGFETs are shown. Enhancement-mode IGFETs are designated in conventional fashion by means of a broken channel bar symbol, while depletion-mode IGFETs are designated by a solid channel bar symbol. In either case, an N-channel IGFET is indicated by an arrow extending inward to the central element of the broken bar or to the solid channel bar, and a P-channel IGFET is indicated by an arrow extending outwardly from the central element of the broken bar or from the solid channel bar. Also, for convenience P-channel IGFETs are further identified by the letter P followed by a particular reference numeral, and N-channel IGFETs are further identified by the letter N followed by a particular reference numeral.

In further pertinent review, each IGFET has a pair of main terminals (source and drain) which define the ends of its conduction channel, as well as a gate electrode, the applied potential on which determines the conductivity of the conduction channel. For a P-channel IGFET, the source terminal is defined as that one of the main terminals having the more positive (higher) voltage potential applied thereto. For an N-channel IGFET, the source terminal is defined as that one of the main electrodes having the more negative (lower) voltage potential applied thereto.

In the case of either an N-channel or a P-channel enhancement-mode IGFET, the IGFET is normally not conducting and conduction occurs when the applied gate-to-source potential ($V_{GS}$) is both of the proper polarity to turn on the transistor, and is greater in magnitude than the threshold voltage $V_T$ of the particular transistor. To turn on a P-channel enhancement-mode IGFET, the voltage ($V_G$) must be more negative than the source voltage $V_s$ by at least $V_T$. To turn on an N-channel enhancement mode IGFET, $V_G$ must be more positive than $V_S$ by at least $V_T$.

In the case of either an N-channel or a P-channel depletion-mode IGFET, the IGFET is normally conducting, and becomes either more or less conducting depending upon the applied gate-to-source potential ($V_{GS}$). Gate voltage of the proper polarity and magnitude induces a depletion region in the IGFET channel, which can render the depletion-mode IGFET less conducting, e.g. turn the IGFET off. To turn off a P-channel depletion-mode IGFET a positive gate voltage is applied. To turn off an N-channel depletion-mode IGFET, a negative gate voltage is applied.

Finally, it should be noted that, in the following discussion, any potential at, or near, ground is arbitrarily defined as a logic "low" (or binary "0"), and any potential at or near $+V_{DD}$ volts is arbitrarily defined as logic "high" (binary "1").

Referring now to the drawings in detail, FIG. 1 is an electrical schematic diagram of a Reset/Set latch 10, which as will be understood by those skilled in the art, may be formed on a monolithic semiconductor integrated circuit chip along with a multiplicity of other circuits. The latch 10 has first and second data input nodes R and S, (for "Reset" and "Set"), and first and second normally-complementary data output nodes, Q and $\overline{Q}$. The latch circuit 10 also includes a pair of voltage supply nodes, respectively designated, for purposes of example, $+V_{DD}$ and ground 12. The voltage supply nodes $+V_{DD}$ and ground 12 may also be viewed as voltage supply lines of the overall integrated circuit device, of which the latch circuit 10 is but a small part. In the latch circuit 10, the $+V_{DD}$ potential is, for example, +5 volts with respect to ground potential.

Parasitic capacitances are associated with the data output nodes Q and $\overline{Q}$, these parasitic capacitances being schematically represented by fixed capacitors 16 and 18 shown in phantom.

The latch circuit 10 includes a first pair 20 of IGFETs of one channel conductivity type, in this example P-channel enhancement-mode IGFETs P22 and P24. The channels of the IGFETs P22 and P24 are respectively arranged to selectively electrically connect the Q and $\overline{Q}$ data output nodes to the $+V_{DD}$ voltage supply node. Accordingly, the transistor P22 and P24 drain terminals 26 and 28 are connected to the data output nodes Q and $\overline{Q}$, and the source terminals 30 and 32 are connected to $+V_{DD}$. As will be appreciated, the substrate connections 34 and 36 of the P-channel IGFETs P22 and P24 of the first pair 20 are also connected to $+V_{DD}$.

In a cross-coupled latching configuration, the gates of the two IGFETs P22 and P24 of the first pair 20 are cross-connected. In particular, the gate 38 of the IGFET P22 is electrically connected to the $\overline{Q}$ data output node, and the gate 40 of the IGFET P24 is electrically connected to the Q data output node.

The latch 10 includes a second pair 42 of IGFETs of opposite conductivity type, e.g. N-channel enhancement mode IGFETs N44 and N46. (To ensure reliable operation of the latch 10, the conductances of the N-channel IGFETs N44 and N46 of the second pair 42 are greater than the conductances of the P-channel IGFETS P22 and P24 of the first pair 20.)

The channels of the IGFETs N44 and N46 are respectively arranged to selectively electrically connect the Q and $\overline{Q}$ data output nodes to the other of the voltage supply nodes, e.g. to circuit ground 12. Accordingly, the transistors N44 and N46 of the second pair 42 have drain terminals 48 and 50 connected to the data output nodes Q and $\overline{Q}$, and source terminals 52 and 54 connected to circuit ground 12. The N-channel IGFETs N44 and N46 have respective substrate connections 56 and 58 also connected to circuit ground, as is conventional.

The IGFETs N44 and N46 of the second pair 42 have respective gate terminals 60 and 62 connected to the R and S data input nodes, respectively.

Finally, the latch circuit 10 includes a pair of high impedance current leakage paths in the form of resistors 64 and 66 respectively electrically connecting the Q and $\overline{Q}$ data output nodes to the ground voltage supply node 12.

From an external viewpoint, the latch circuit 10 operates in accordance with the conventional "R/S Latch Truth Table" set forth above in the "Background of the Invention". Considering the operation in greater detail, it will be assumed first that both the R and S data inputs are low. Thus, both transistors N44 and N46 of the second pair 42 are off, since their gate terminals 60 and 62 are at essentially the same potential as their source terminals 52 and 54. Under these conditions, the transistors P22 and P24 of the first pair 20, together with the leakage paths 64 and 66, comprise a bistable latch stable in either the condition with Q high and $\overline{Q}$ low or the condition with Q low or $\overline{Q}$ high. More particularly, if for example the transistor P22 is conducting, then the Q output is pulled to $+V_{DD}$ through the transistor P22. Since the gate 40 of the transistor P24 is cross-coupled to the Q output, the transistor P24 gate 40 is essentially at the same potential as the source terminal 32, and the transistor P24 is therefore off. This allows the $\overline{Q}$ output to be maintained at logic low (ground) through the leakage path 66. Since the gate 38 of the transistor P22 is cross-connected to the $\overline{Q}$ data output node, the transistor P22 gate 38 is more negative than the source terminal 30, maintaining the transistor P22 in a conducting condition.

In a complementary manner, still assuming that both the R and S data inputs are low and the transistors N44 and N46 of the second pair 42 are not therefore conducting, the first pair 20 of transistors and the leakage paths 64 and 66 can maintain a stable condition with the transistor P22 non-conducting and the data output Q held at logic low through the leakage path 64, and the transistor P24 conducting and pulling the $\overline{Q}$ data output node high.

When the Set (S) input goes high, with the Reset (R) input remaining low, then the transistor N46, operating in a common-source circuit configuration, turns on, pulling the $\overline{Q}$ data output node towards logic low, and discharging the parasitic capacitance 18. The transistor N46 is able to pull the $\overline{Q}$ data output node sufficiently low to begin turning on the transistor P22 of the first pair 20 by virtue of the cross-connection of the gate 38 to the $\overline{Q}$ data output node, thereby pulling the Q data output node high. By virtue of the cross-connection of the IGFET P24 gate 40 to the Q data output node, the transistor P24 turns fully off, allowing the $\overline{Q}$ data output to be pulled fully to logic low through the transistor N46. Thus the switching action is regenerative. Thereafter when the S data input returns to logic low, the $\overline{Q}$ data output is maintained low through the leakage path 66.

In complementary fashion, assuming the Q data output is initially at logic high with the transistor P22 conducting, and the $\overline{Q}$ data output node is initially at logic low with the transistor P24 not conducting, when the Reset (R) data input goes high, with the Set (S) data input remaining low, the latch circuit 10 is toggled to the opposite state, i.e., Q low and $\overline{Q}$ high.

Finally, considering the input condition where both the R and S inputs are high, from the truth table hereinabove it may be seen that the desired output condition is with both the normally-complementary data outputs Q and $\overline{Q}$ at logic low. This condition is achieved since both the transistors N44 and N46 of the second pair 42 become conducting, pulling both of the normally-complementary data output nodes Q and $\overline{Q}$ towards logic low. Under these conditions, the transistors P22 and P24 of the first pair 20 are partially conducting. Thus, in effect two voltage dividers are defined, with the Q and $\overline{Q}$ data output nodes at the voltage divider tap points. Although, the Q and $\overline{Q}$ data output nodes are not fully at logic low, they are more nearly at logic low than at logic high for the following reason. The transistors N44 and N46 are turned fully on, since their gate terminals 60 and 62 are connected to full logic high inputs, e.g. the R and S data inputs. However, the transistors P22 and P24 of the first pair 20 are not fully on, because their gate electrodes 38 and 40 are tied to the $\overline{Q}$ and Q data output nodes which, as noted above, are not fully at logic low. These conditions are terminated when either the R terminal or the S terminal is brought low.

While in the latch circuit described, the high impedance current leakage paths are provided in the form of very high resistances to avoid accumulation of charge on the nodal capacitances when at ground and thereby affecting the stability of the latch over a period of time, they may be eliminated if such accumulation is sufficiently small over the period of time the latch is required to operate.

Figure 2A:
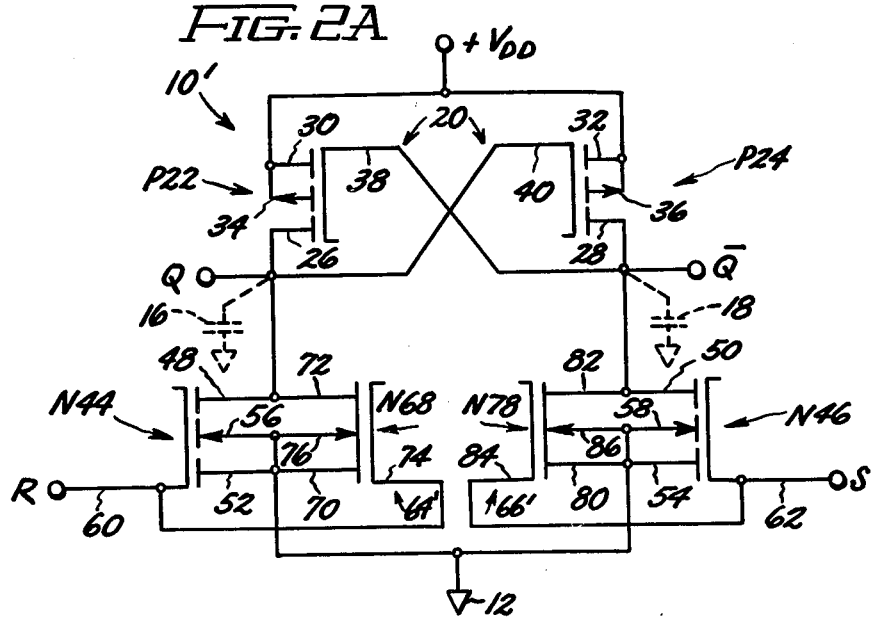
FIG. 2A is an electrical schematic diagram of an R/S latch circuit representing in accordance with the invention a modification of the circuit of FIG. 1.

With reference now to FIG. 2A, shown in another latch circuit 10' in accordance with the invention, the circuit 10' of FIG. 2 differing from the circuit 10 of FIG. 1 in that the FIG. 1 leakage paths 64 and 66 in FIG. 2A comprise circuits 64' and 66'.

More particularly, the leakage circuit 64' comprises a depletion-mode N-channel IGFET N68 having source 70 and drain 72 terminals respectively connected to circuit ground 12 and to the Q data output. The transistor N68 has a gate terminal 74 connected to the source terminal 70 and ground. In accordance with conventional practice, the substrate terminal 76 of the N-channel IGFET N68 is connected to ground.

Similarly, the leakage circuit 66' comprises a depletion-mode N-channel IGFET N78 having source and drain terminals 80 and 82 connected respectively to ground and to the $\overline{Q}$ data output node and having a gate electrode 84 connected to the source terminal 80 and ground. A substrate terminal 86 is connected to ground.

It will be appreciated that the latch circuit 10' of FIG. 1 operates substantially identically to the latch circuit 10 of FIG. 1, and a detailed description thereof accordingly will not be repeated. However, the manner in which the depletion-mode transistors N68 and N78 function to provide leakage current paths will be described for the condition at which terminal R is at a logic high and the terminal S is at a logic low, and the condition at which terminal R is at a logic low and terminal S is at a logic high.

With terminal R at a logic high and terminal S at a logic low the depletion-mode transistor N68 would provide a specific channel resistance determined by its design as its source is connected to ground and its gate is high. This resistance is in parallel with the ON resistance of the transitor N44, is much greater than the ON resistance of transistor N44 and would have negligible effect pulling node Q to ground. Also with terminal R at a logic high and terminal S at a logic low the depletion-mode transistor N78 would provide a specific high resistance determined by its design as its source and gate are connected to ground. This resistance is in parallel with nodal capacitance 18 and would provide some small amount of loading on node $\overline{Q}$ which is connected to $V_{DD}$ through transistor P24 which is turned on by Q being pulled low. When terminal R is returned to logic low, the node Q is at a logic low with the channel resistance of the depletion mode transistor N68 constituting the leakage path for any charge accumulating on node Q through transistor P22.

With terminal R at a logic low and terminal S at a logic high, the functioning of transistors N68 and N78 in the situation described in the preceding paragraph are interchanged.

Another circuit shown in FIG. 2B identical to the circuit of FIG. 2A except that the gates of transistors N68 and N78 are connected to ground. In this circuit as the source and gates of transistors N68 and N78 are connected to ground a specific fixed value of resistance is provided between each of nodes Q and $\overline{Q}$ and ground. When a node is low this resistance leaks any charge accumulated thereon to ground. When a node is high this resistance produces only a small drain on the source of voltage $V_{DD}$.

A further circuit is shown in FIG. 2C identical to the circuit of FIG. 2A except that the gates of transistors N68 and N78 are connected respectively to nodes Q and $\overline{Q}$. In this circuit the depletion-mode transistor connected to the node which is low would provide a specific value of resistance as its gate and source are essentially at ground. The depletion-mode transistor connected to the node which is high would provide a lower value of resistance as its gate is high and its source is at ground. This condition would represent additional loading on the source of $V_{DD}$. For this reason, circuits of FIGS. 2A and 2B are preferable.

Figure 3:
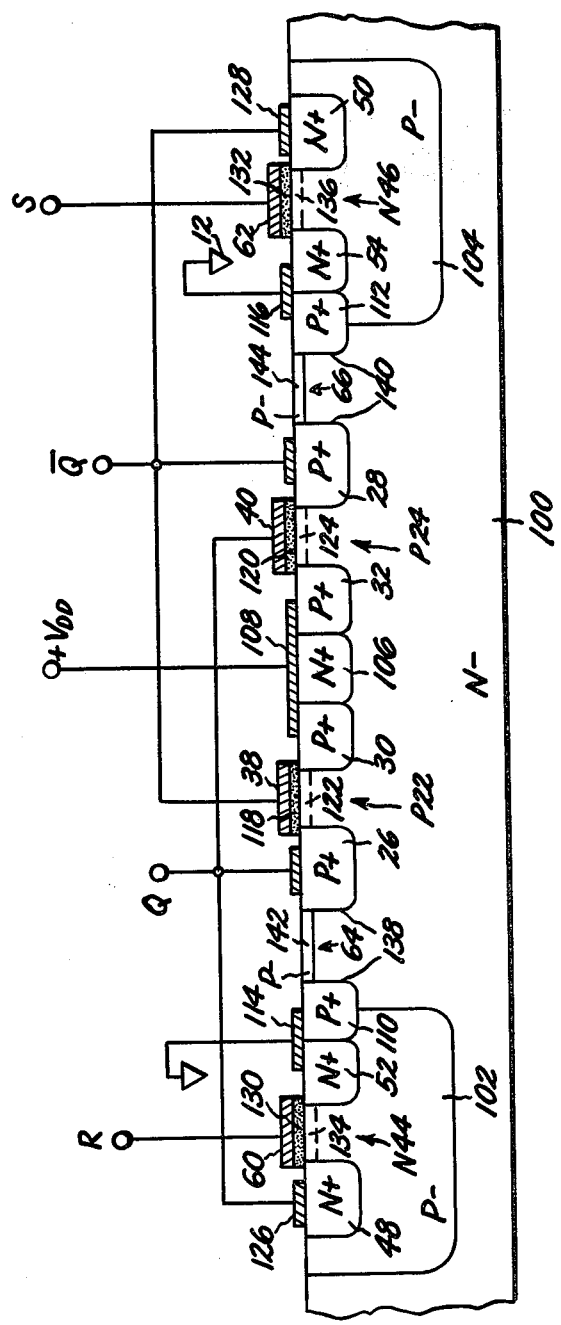
FIG. 3 is a schematic cross-sectional representation of the physical structure of an R/S latch circuit in accordance with the invention and corresponding to the circuit of FIG. 1.

With reference now to FIG. 3, a specific structure implementing the circuit of FIG. 1 is shown. For convenience, identical reference numerals are employed in FIG. 3 to designate structural elements corresponding to symbols in the electrical schematic diagram of FIG. 1. It will be appreciated that, while FIG. 3 depicts an exemplary structure, it is nevertheless a highly schematic depiction, omitting a number of conventional features required in practical devices, as will be appreciated by those skilled in the art. Also, FIG. 3 is a cross-sectional view only, and indicates the required surface metallization pattern in a schematic manner only.

The structure of FIG. 3 is formed on a portion 100 of an N$^-$ conductivity type silicon semiconductor substrate wafer which, as will be appreciated, is but a small portion of an overall integrated circuit device. The P$^-$ conductivity type substrate required for complementary N-channel IGFETs is obtained by diffusing a lightly-doped well region comprising portions 102 and 104 into the N$^-$ conductivity type substrate 100.

In order to maintain the N$^-$ conductivity type substrate 100 at +$V_{DD}$ potential, an ohmic contact to +$V_{DD}$ is provided by means of a heavily-doped N+ conductivity type contact region 106 diffused into the substrate 100 and in ohmic contact with +$V_{DD}$ via a contact metallization area 108.

Similarly, in order to maintain the P$^-$ conductivity type well region portions 102 and 104 at ground potential, ohmic contacts are provided in the form of heavily-doped P+ contact regions 110 and 112 adjoining the P$^-$ well portions 102 and 104 and connected to circuit ground 12 via respective metallization areas 114 and 116. So long as proper supply voltage is supplied to the circuit, all PN junction diodes defined within the substrate 100 are reverse biased.

The P-channel IGFETs P22 and P24 of the first pair 22 are formed within the N$^-$ conductivity type substrate 100 in conventional fashin by providing P+ conductivity type terminal regions 26, 28, 30 and 32 within the substrate 100. The P+ conductivity type terminal regions 30 and 32 comprising the source terminals of the P-channel IGFETs P22 and P24, being connected to +$V_{DD}$, are laterally adjacent the N+ contact region 106, and share the same metallization 108 therewith.

To complete the structures of the P-channel IGFETs P22 and P24 of the first pair, their respective gate electrodes 38 and 40 are spaced from the substrate 100 by insulating layers 118 and 120. The insulating layers 118 and 120 may comprise any suitable insulating material, for example, silicon dioxide. The gate electrodes 38 and 40 themselves may comprise any suitable conductive material, such as aluminum or highly-doped polycrystalline silicon. Since the IGFETs P22 and P24 are enhancement-mode devices, conduction channels only exist when induced by suitable volages on the gate electrodes 38 and 40, these induced conduction channels being represented at 122 and 124.

The N-channel IGFETs N44 and N46 of the second pair 42 are formed within the P− conductivity type well region portions 102 and 104. The N+ drain regions 48 and 50 of the two N-channel IGFETs N44 and N46 are in ohmic contact with respective contact metallization areas 126 and 128. The N+ source regions 52 and 54 of the transistors N44 and N46 are laterally adjacent the P+ contact regions 110 and 112, respectively, sharing common metallization 114 and 116 therewith in each case.

To complete the structures of the N-channel IGFETs N44 and N46 of the second pair, their respective gate electrodes 60 and 62 are spaced from the substrate 100 by insulating layers 130 and 132. Since the IGFETs N44 and N46 also are enhancement-mode devices, conduction channels only exist when induced by suitable voltages on the gate electrodes 60 and 62, these induced conduction channels being represented at 134 and 136.

In FIG. 3, the P+ drain regions 26 and 28 of the transistors P22 and P24 of the first pair 20 are respectively laterally spaced from the P+ contact regions 110 and 112, and define respective gaps 138 and 140 therebetween within which the leakage paths 64 and 66 are formed. In the embodiment of FIG. 3, these leakage paths 64 and 66 comprise P− (e.g. lightly-doped P conductivity type) implanted regions 142 and 144 formed in the respective gaps 138 and 140. It will be appreciated that, through suitable process control, the leakage paths 64 and 66 can be formed to have the desired resistance value.

Figure 5A:
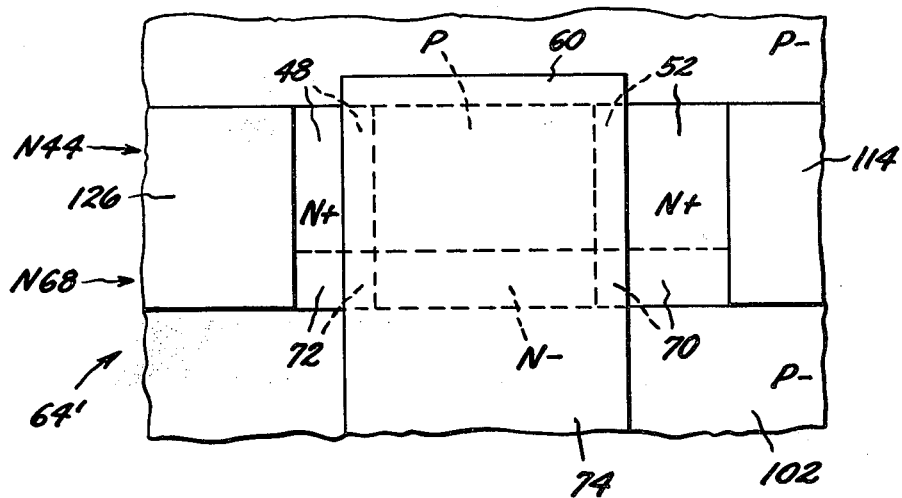
FIGS. 5A and 5B show plan views of the physical structure of FIG. 4 showing the depletion mode N-channel IGFETs connected in parallel with the enhancement-mode N-channel IGFETs.
Figure 5B:
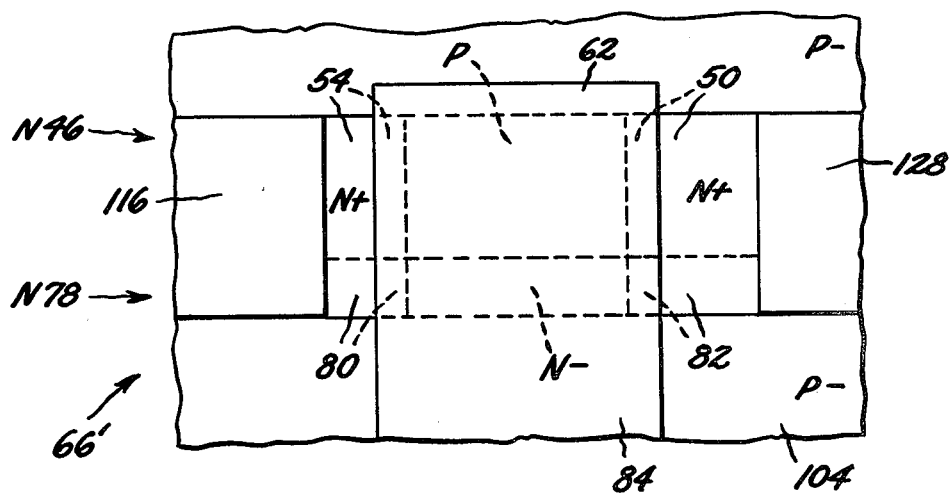

Referring to FIGS. 4, 5A and 5B, a specific structure implementing the circuit of FIG. 2A is shown, differing from the structure of FIG. 3 in that the implanted regions 142 and 144 in respective gaps 138 and 140 are eliminated and the leakage circuits 64′ and 66′ comprise depletion mode N-channel transistors. Again, for convenience, identical reference numerals are employed in FIG. 4 to designate structure elements corresponding to symbols in the electrical schematic circuit diagram of FIG. 2.

The leakage circuit 64′ comprises an N-channel depletion-mode IGFET N68 shown in plan view in FIG. 5A and an N-channel depletion-mode IGFET N78 shown in plan view in FIG. 5B.

To provide depletion-mode IGFET N68 a small portion of the channel region 134 thereof is lightly doped N-type conductivity by implantation of a suitable N-type dopant therein. By this simple structural change N-channel depletion-mode transistor 68 is provided connected in parallel with N-channel enhancement-mode transistor 44. Similarly, to provide depletion-mode IGFET N78 connected in parallel with enhancement-mode transistor 46, a small portion of the channel region 136 thereof is rendered lightly doped N-type conductivity by implantation of a suitable N-type dopant therein.

While the leakage paths 64 and 66 of FIG. 1 have been implemented in FIG. 3 by means of respective implanted regions 142 and 144 and leakage paths 64′ and 66′ of FIG. 2A have been implemented in FIG. 4 by means of respective depletion mode transistors N68 and N78, these leakage paths could be provided by other means. One such means is by design of the desired leakage in the reverse biased junctions formed between N+ region 48 and P− well region 102 and between N+ region 50 and P− well region 104 of FIG. 3. Another such means is by suitable design of N-channel transistors N44 and N46 to provide the desired channel leakage when these transistors are in the OFF condition. A further such means is the provision of a resistive sea of polycrystalline silicon between each of the nodes Q and Q and respective P+ drain regions 26 and 28 of FIG. 3. The manner of selectively providing such resistive elements between regions in the substrate and overlying terminals is shown and described as element 222 in FIG. 4 of U.S. patent application Ser. No. 451,689, filed Dec. 20, 1982, incorporated hereby by reference thereto and assigned to the assignee of the present invention.

While specific embodiments of the invention have been illustrated and described herein, it is realized that numerous modifications and changes will occur to those skilled in the art. For example, it will be appreciated that the P-conductivity type semiconductor regions can all be changed to N− conductivity type, and vice-versa, and the supply voltage polarities reversed. It is therefore to be understood that the appended claims are intended to cover all such modifications and changes as fall within the true spirit and scope of the invention.

What is claimed is:

1. In an integrated circuit device formed on a semiconductor substrate, a Reset/Set latch comprising:
a pair of voltage supply nodes;
a first pair of insulated-gate field-effect transistors of one channel conductivity type, each transistor of said first pair of transistors including a source region and a drain region of the one conductivity type formed within the substrate, and including an insulated gate electrode on the substrate configured for inducing a conduction channel between said source region and said drain region of each of said first transistor pair, said source regions of said first transistor pair electrically connected to each other and to one of said pair of voltage supply nodes, said gate electrode of one transistor of said first transistor pair being electrically connected to said drain region of the other transistor of said first transistor pair, said gate electrode of said other of said first transistor pair being electrically connected to said drain region of said one of said first transistor pair, and said drain regions of said first transistor pair respectively defining first and second complementary data output nodes;
a second pair of insulated-gate field-effect transistors of opposite channel conductivity type, each of said second pair of transistors including a source region and a drain region of the opposite conductivity type formed within the substrate, and including an insulated gate electrode on the substrate configured for inducing a conduction channel between said source region and said drain region of said second transistor pair, said gate electrodes of said second transistor pair respectively defining first and second data input nodes, said source regions of said second transistor pair electrically connected to each other and to the other of said pair of voltage supply nodes, and said drain regions of said second transistor pair respectively electrically connected to respective drain regions of said first transistor pair;

each of said transistors of said second pair being formed within its own well region of the one conductivity type;

a pair of ohmic contacts between said well regions and said other voltage supply node, each of said ohmic contacts including a heavily-doped contact region of the one conductivity type at a surface of the substrate and adjoining the respective well region;

a pair of depletion-mode field-effect transistors of said opposite channel conductivity type, each having an implanted channel region of the opposite conductivity type formed in said semiconductor substrate, said source regions of said second transistor pair respectively serving as source regions of said depletion-mode transistors, said drain regions of said second transistor pair respectively serving as drain regions of said depletion-mode transistors, and the gate of each said depletion-mode transistors connected to the gate of a respective one of said second pair of transistors.

2. In an integrated circuit device formed on a semiconductor substrate, a Reset/Set latch comprising:

a pair of voltage supply nodes;

a first pair of insulated-gate field-effect transistors of one channel conductivity type, each transistor of said first pair of transistors including a source region and a drain region of the one conductivity type formed within the substrate, and including an insulated gate electrode on the substrate configured for inducing a conduction channel between said source region and said drain region of each of said first transistor pair, said source regions of said first transistor pair electrically connected to each other and to one of said pair of voltage supply nodes, said gate electrode of one transistor of said first transistor pair being electrically connected to said drain region of the other transistor of said first transistor pair, said gate electrode of said other of said first transistor pair being electrically connected to said drain region of said one of said first transistor pair, and said drain regions of said first transistor pair respectively defining first and second complementary data output nodes;

a second pair of insulated-gate field-effect transistors of opposite channel conductivity type, each of said second pair of transistors including a source region and a drain region of the opposite conductivity type formed within the substrate, and including an insulated gate electrode on the substrate configured for inducing a conduction channel between said source region and said drain region of said second transistor pair, said gate electrodes of said second transistor pair respectively defining first and second data input nodes, said source regions of said second transistor pair electrically connected to each other and to the other of said pair of voltage supply nodes, and said drain regions of said second transistor pair respectively electrically connected to respective drain regions of said first transistor pair;

each of said transistors of said second pair being formed within its own well region of the one conductivity type;

a pair of ohmic contacts between said well regions and said other voltage supply node, each of said ohmic contacts including a heavily-doped contact region of the one conductivity type at a surface of the substrate and adjoining the repective well region;

a pair of depletion-mode field-effect transistors of said opposite channel conductivity type, each having an implanted channel region of the opposite conductivity type formed in said semiconductor substrate, said source regions of said second transistor pair respectively serving as source regions of said depletion-mode transistors, said drain regions of said second transistor pair respectively serving as drain regions of said depletion-mode transistors, and the gate of each said depletion-mode transistors connected to the source of a respective one of said second pair of transistors.

* * * * *